United States Patent [19]
Babbs et al.

[11] Patent Number: 5,853,214
[45] Date of Patent: Dec. 29, 1998

[54] ALIGNER FOR A SUBSTRATE CARRIER

[75] Inventors: Daniel A. Babbs; Richard E. Schultz, both of Austin, Tex.

[73] Assignee: Progressive System Technologies, Inc., Austin, Tex.

[21] Appl. No.: 563,134

[22] Filed: Nov. 27, 1995

[51] Int. Cl.$^6$ ................................................. B65D 85/30
[52] U.S. Cl. ........................ 294/161; 206/711; 211/41.18; 294/162
[58] Field of Search ................................. 294/87.1, 159, 294/161, 163; 118/500, 503; 206/454, 455, 707, 708, 711; 211/40, 41

[56] References Cited

U.S. PATENT DOCUMENTS

| | | | |
|---|---|---|---|
| 2,953,253 | 9/1960 | Henderson et al. | 211/41 |
| 3,486,631 | 12/1969 | Rodman | 211/41 |
| 3,682,083 | 8/1972 | Puente | 211/41 |
| 4,153,164 | 5/1979 | Hofmeister et al. | 211/41 |
| 4,418,820 | 12/1983 | Nagle et al. | 206/707 |
| 4,858,764 | 8/1989 | Domokos | 206/711 |
| 5,064,236 | 11/1991 | Stanfield | 294/161 |

*Primary Examiner*—Johnny D. Cherry
*Attorney, Agent, or Firm*—Akin, Gump, Strauss, Hauer & Feld

[57] ABSTRACT

A substrate aligner for a substrate carrier or cassette including an engagement assembly for moving and maintaining one or more substrates into an aligned position when closed, and an actuator assembly for opening and closing the engagement assembly. In one embodiment, the engagement assembly includes front and back engagement assemblies for mounting at opposite corners of the housing to thereby interface opposite corners of the substrates. Each engagement assembly preferably includes a roller for interfacing a corresponding edge of each the substrates, where the front assembly includes two rollers for interfacing front edges and adjacent side edges, and the back engagement assembly includes two rollers for interfacing the back edges and the opposite side edges of the substrates. In this manner, the engagement assembly interfaces all four edges of each substrate to thereby manipulate and maintain the substrates into a substantially aligned position when closed. The rollers preferably rotate to avoid scraping of the substrate edges which might otherwise generate contaminating particulate. Furthermore, the rollers have compliant outer surfaces to dampen potentially damaging forces. Thus, the compliant rollers sufficiently constrain the substrates to prevent significant movement, while also protecting the substrates from g-forces, harsh movements and vibrations during transport. The actuator assembly preferably includes a bistable, four bar linkage including two stable and locked modes corresponding to the open and closed positions. In an alternative embodiment, the housing includes back stops and front bumpers to facilitate front to back alignment, and side-mounted single-roller assemblies for lateral alignment.

50 Claims, 11 Drawing Sheets

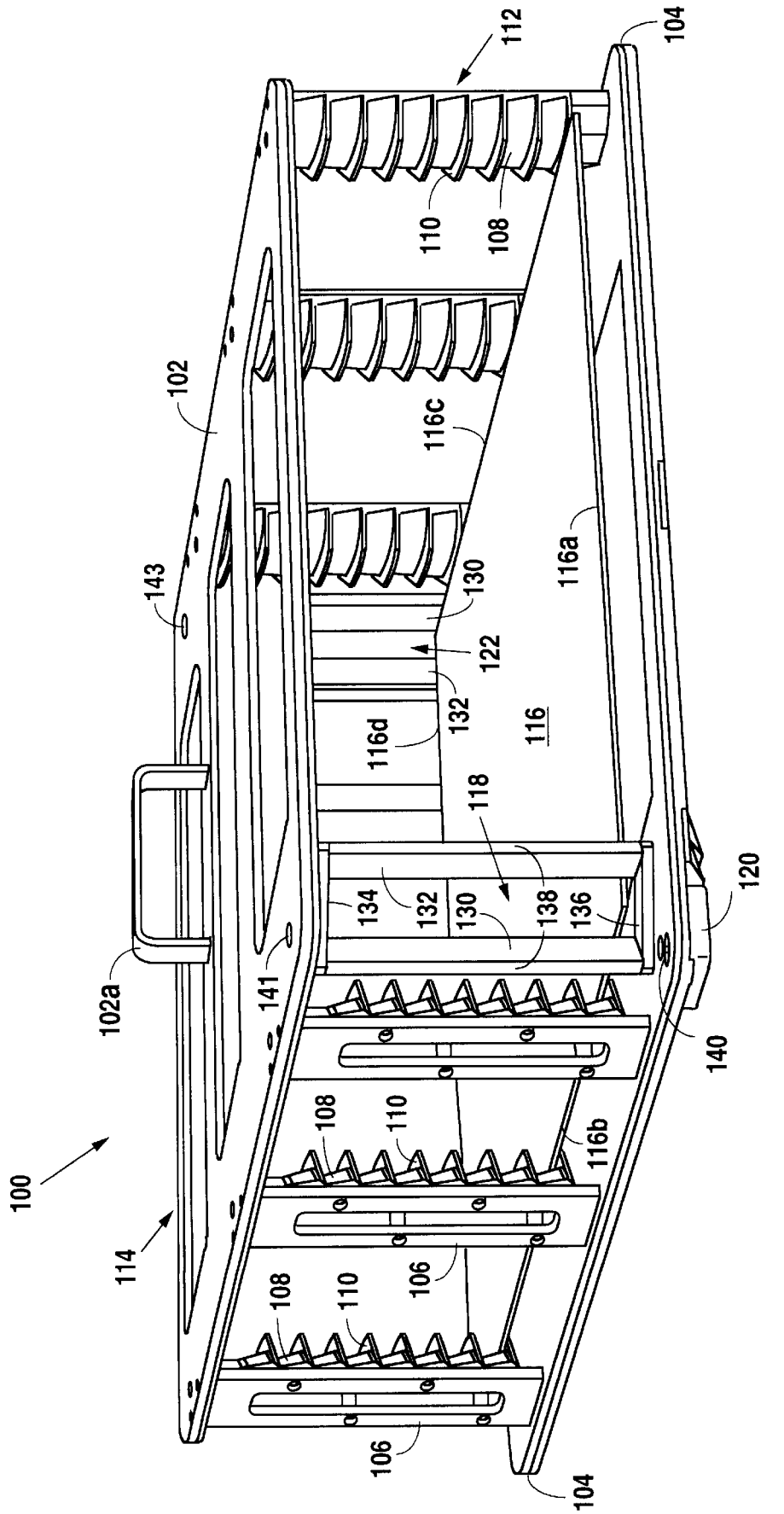

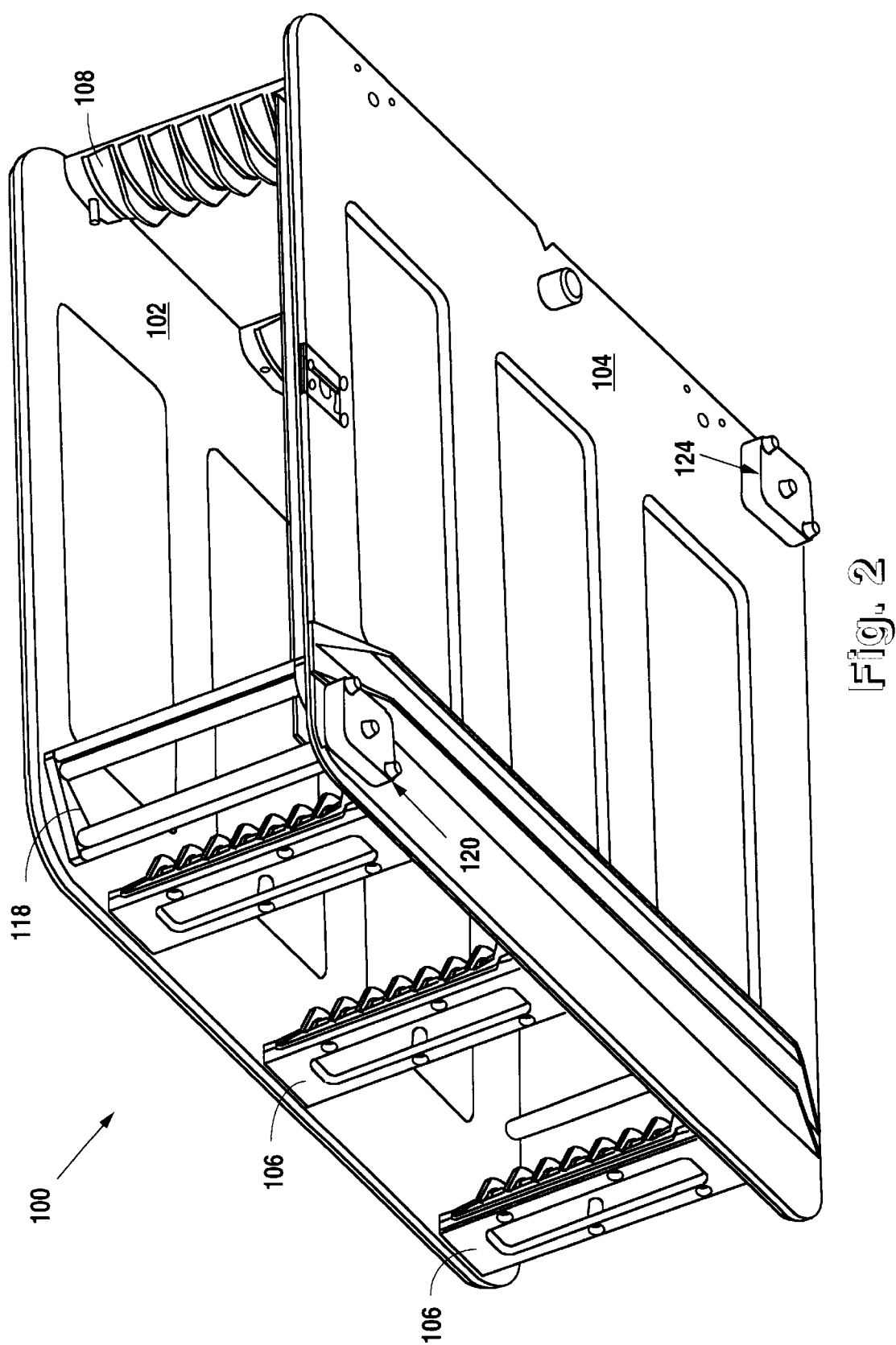

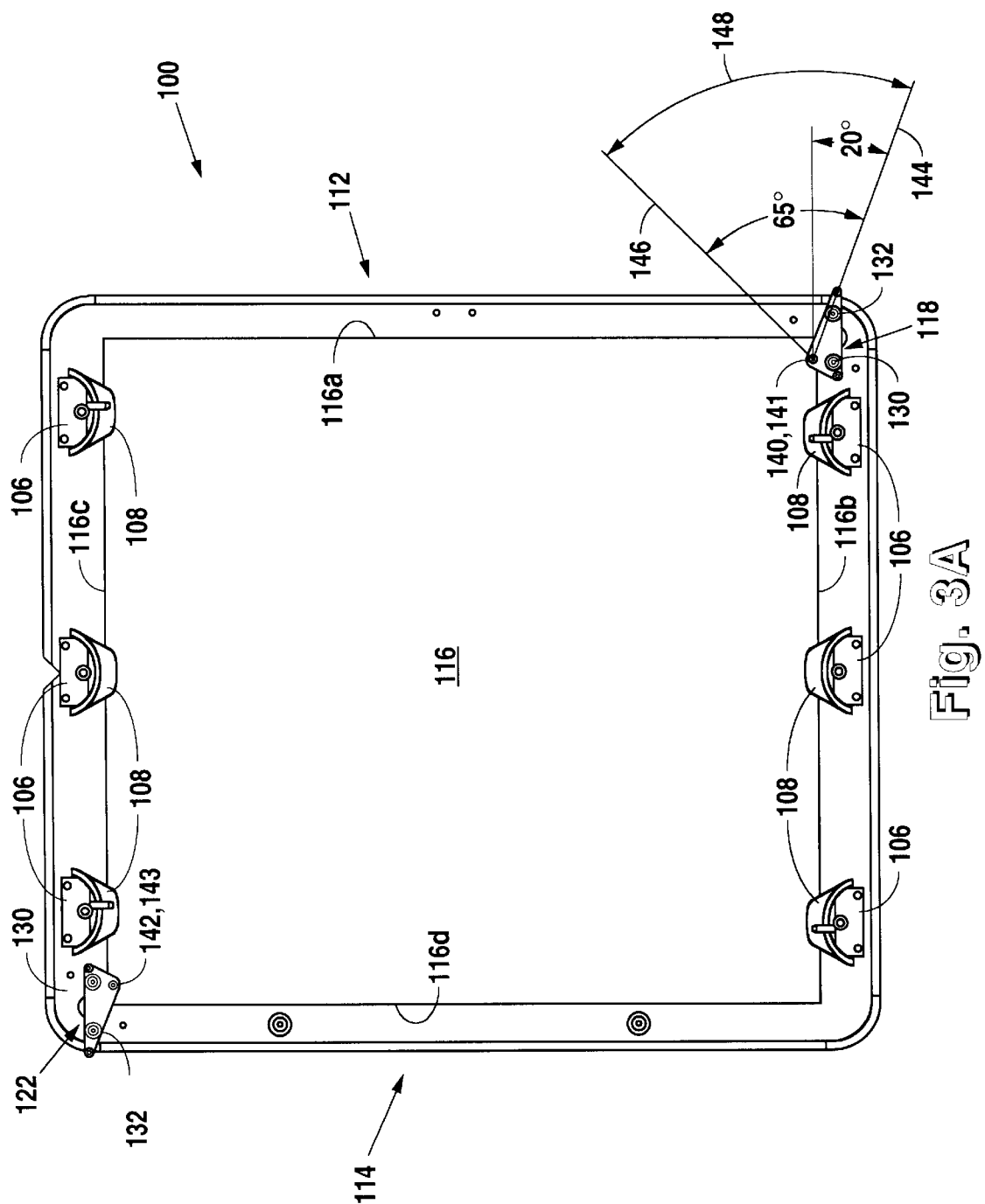

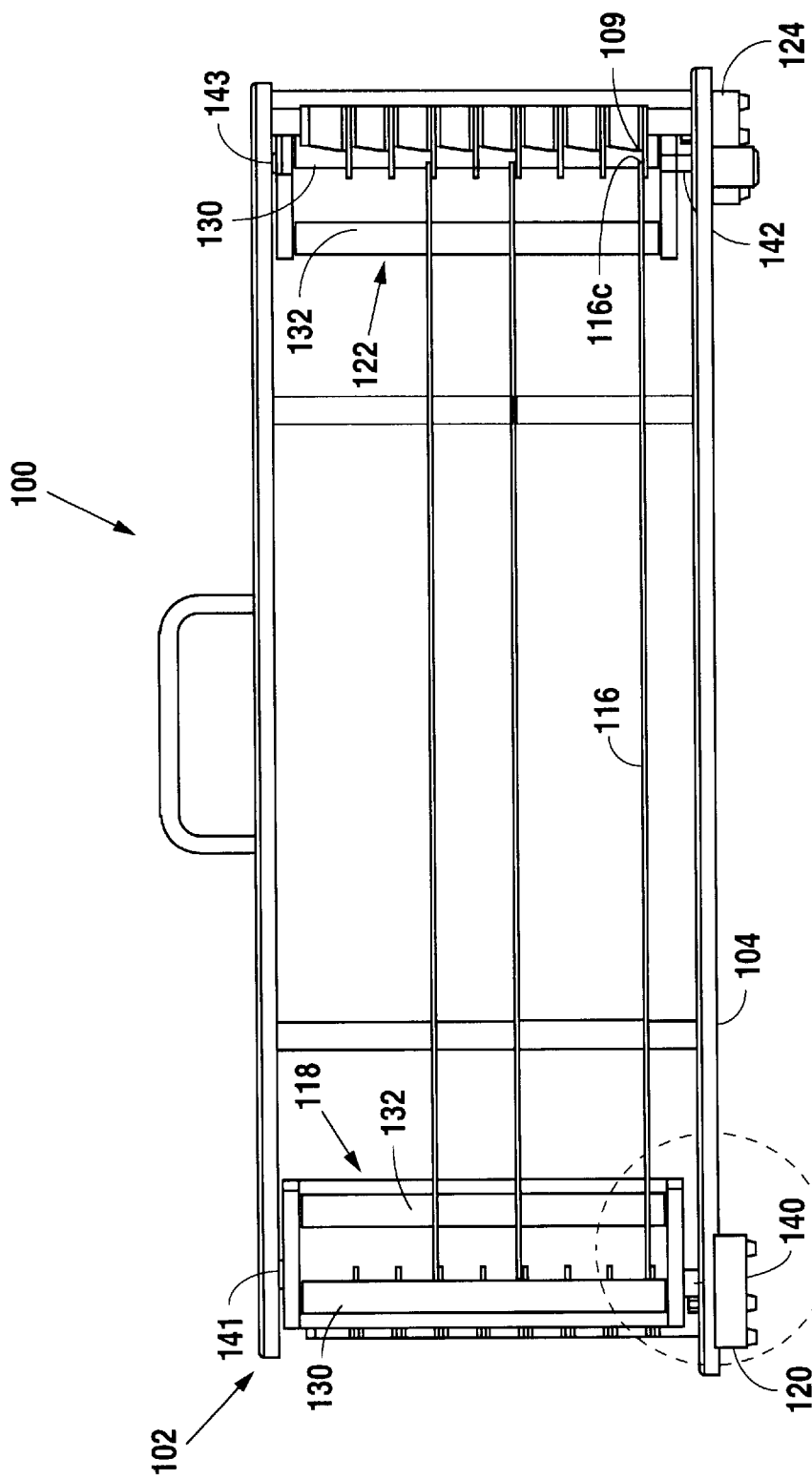

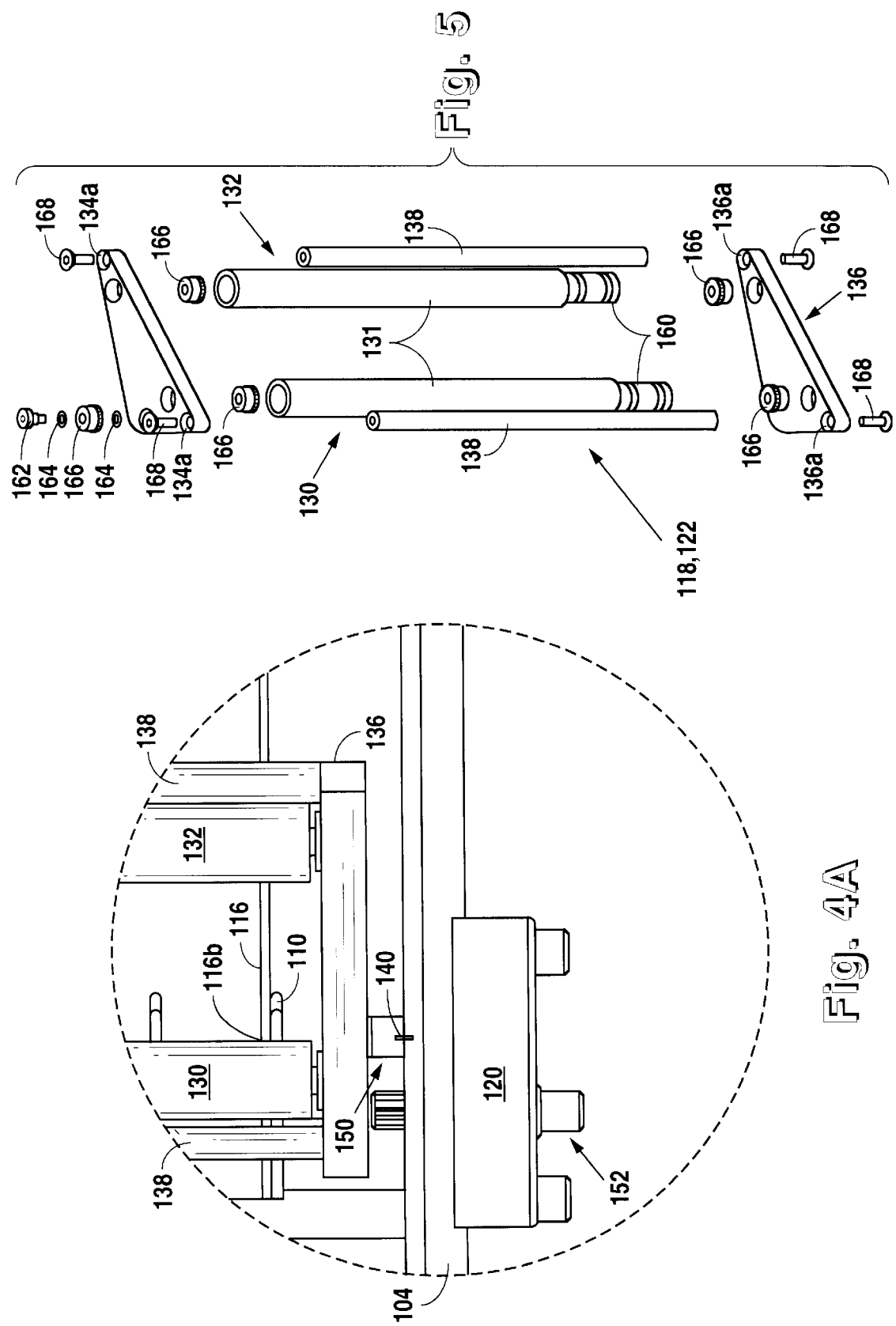

ALIGNER FOR A SUBSTRATE CARRIER

FIELD OF THE INVENTION

The present invention relates to carrier devices for substrates, such as semiconductor wafers, micro-chip modules and flat panel displays, and more particularly to a substrate aligner for aligning the substrates while placed within the carrier.

DESCRIPTION OF THE RELATED ART

There is an increasing demand for larger substrates in the flat panel display (FPD) and micro-chip module (MCM) industries. Substrates were initially relatively small, such as, for example, four, six and eight inch semiconductor wafers and 300 millimeters (mm)×350 mm FPDs. Smaller substrates are relatively easy for human operators to handle. For example, a plurality of the smaller substrates were typically loaded into substrate carriers and carried between processing stations by human operators. Even a plurality of such substrates in an appropriately sized carrier was relatively manageable. As the substrates continued to get larger and as the circuitry geometries continued to shrink with improvements and advancements in process technologies, however, the FPD and MCM industries were challenged with developing cost effective solutions for handling the substrates.

The size of the substrates are continuing to increase and presently include FPDs of 650 mm×550 mm to 850 mm×1050 mm. The majority of the substrates are made from glass, having thicknesses ranging from 0.7 mm to 1.1 mm. Improvements in process technology continually decrease the circuitry geometry processed on the substrates. In this manner, substrates are increasing in size, weight and cost, while at the same time becoming increasingly delicate and susceptible to damage from external forces and contamination during processing. It is becoming more important to increase yields of the larger and more expensive substrates, so that handling by human operators is not a desirable nor acceptable option.

Handling schemes have been developed to maintain substrates in a fixed horizontal position while being transported on a cart or automated vehicle from one processing station to another. Substrate handling in this manner still presented problems of poor yield due to damage and contamination. The design of the flooring in the clean room environment became a critical factor since variations in the floor's surface resulted in the substrates on the cart being exposed to vibrations and high g-forces. Such forces tended to crack and permanently damage one or more substrates. In addition, the circuitry processed on the substrate is susceptible to damage from stress cracks created in the metal films applied to the surface of the substrates when impacted by high g-forces. Even if the substrates were not damaged by the high g-forces, the movements and vibrations caused sliding of the substrates in the carriers, thereby releasing contaminating particles.

It is also desired to increase the transfer speed and throughput of the process tools. Robotic equipment has achieved increased throughput, where substrates housed in carriers are extracted and inserted by robotic pick and place units. However, such automated equipment requires some form of alignment of the substrates, either manually or by some automatic means. Traditional carriers often included drafted or slanted walls in the carrier slots that would grossly align the substrate within the carriers. However, such drafted features resulted in little clearance between the substrates and the side walls of the slots, so that the substrates had to be extracted or inserted relatively slowly and with precision to avoid collision with the carrier or scraping of the sidewalls. As a result, each transfer took more time, which substantially decreased overall throughput.

It is desired to provide an efficient and improved means of supporting and constraining substrates during transport to reduce damage and contamination, thereby increasing yields. Further, it is desired to improve alignment in such a manner to improve transaction speed and process throughput.

SUMMARY OF THE INVENTION

A substrate aligner according to the present invention is mounted to a substrate carrier or cassette and includes an engagement assembly for engaging, moving and maintaining the plurality of substrates into a substantially aligned position when the engagement assembly is closed, and an actuator assembly for moving the engagement assembly between open and closed positions. In one embodiment, the engagement assembly includes front and back engagement assemblies for mounting at opposite corners of the housing to thereby interface opposite corners of the substrates. Each engagement assembly preferably includes an engagement member for interfacing a corresponding edge of each of the substrates, where the front assembly includes two engagement members for interfacing front edges and adjacent side edges, and the rear or back engagement assembly includes two engagement members for interfacing the back edges and the opposite side edges of the substrates. In this manner, the engagement assembly interfaces all four edges of each substrate to thereby manipulate and maintain the substrates into a substantially aligned position when closed.

The engagement assembly has an open position for enabling access of the substrates by a processing station, where the substrates may be inserted or extracted by the processing station until processing is completed. The engagement assembly is then closed to move, align and maintain the substrates in the aligned position for transportation. In the preferred embodiment, the engagement members are rollers which rotate while engaging the edges of the substrates. Such rotation avoids scraping of the edges which might otherwise generate contaminating particulate. Furthermore, the rollers have compliant outer surfaces or otherwise include compliant sheaths to dampen vibration forces from substantially affecting the substrates. Thus, the compliant rollers sufficiently constrain the substrates to prevent significant movement, while also protecting the substrates from g-forces, harsh movements and vibrations during transport.

A substrate aligner according to the present invention alleviates the need for alignment by the combs or spaced shelves as typically found in traditional carriers of prior art. For example, the walls of the slots of prior carriers were slanted so that the substrate was abutted against the slot wall with little clearance. Such narrow clearances of traditional carriers slowed the throughput of the processing stations, since the robotic pick and place units had to insert and extract the substrates at relatively slow speeds to avoid collision and/or scraping of the substrates against the slot walls of the combs. Using a substrate aligner according to the present invention, the side walls of the combs are not necessary for alignment purposes, thereby allowing wider slots and relatively large clearances between the edges of the substrates and the walls of the slots. In this manner, the robotic pick and place units of the processing station may insert and extract the substrates at higher speeds since there is substantially less risk of collision and/or scraping of the substrates.

An actuator assembly is preferably provided to open and close each engagement assembly. The actuator assembly preferably includes an input shaft for interfacing a motor and gear assembly of a processing station, and a multiple bar linkage for manipulating an output shaft coupled to the engagement assembly. The multiple bar linkage preferably includes four links and is preferably bistable, including two stable modes corresponding to the open and closed positions. In this manner, the four bar linkage locks the engagement assembly in either the open or closed positions.

In the preferred embodiment, the multiple bar linkage is implemented using an over-center design to achieve the bistable, locking positions. The multiple bar linkage preferably includes a drive crank pivotally mounted to an actuator housing. A coupler member is pivotally mounted between the drive crank and a rocker, which correspondingly moves the output shaft between first and second positions corresponding to the open and closed positions of the engagement assembly. The drive crank is preferably pivoted between the first and second positions about a drive crank pivot point, which correspondingly extends a line of force defined by the coupler member beyond a horizontal reference line centered at the drive crank pivot point to achieve the over-center design. An extension spring is coupled to the coupler member for engaging and enforcing the locked positions. In this manner, forces applied to the substrates, resulting in torque forces applied to the engagement assemblies, are prevented from moving the assembly out of the locked position. Thus, when the substrate aligner is closed, the substrates are constrained and protected during transport.

In an alternative embodiment, the housing includes back stops mounted on the back side for engaging the back edges of the substrates. The housing further includes a pivotally mounted front door with front bumpers, which engage the front edges to move the substrates against the back stops into a substantially aligned position in the front-to-back direction when the front door is closed. Two engagement assemblies are also provided on either side of the housing for engaging and laterally moving the substrates into a substantially aligned position in the lateral direction. In this manner, the substrates are aligned in the front-to-back direction using the back stops and front bumpers and are aligned in the lateral position using the side-mounted engagement assemblies. This embodiment may be used for open-air carriers, but is preferably used for enclosed carriers for maintaining the substrates in a clean environment while being transported through a non-clean room environment.

The side-mounted engagement assemblies preferably include a single roller for engaging a corresponding side of the substrates. Only a single roller is necessary on either side to achieve lateral alignment. Again, the roller is pivotally mounted to allow rotation while engaging the edge of the substrate without scraping. Also, the roller includes a compliant outer surface or a compliant sheath to dampen vibration or other damaging forces thereby protecting the substrates. Furthermore, the roller assemblies are mounted off-center to ensure that the substrates are not maintained in a slightly rotated position when the substrate aligner is closed. The actuator assemblies for the side-mounted engagement assemblies may be implemented in a similar manner as that described for the first embodiment.

It is now appreciated that a substrate carrier implemented according to the present invention provides accurate alignment of the substrates in a cassette or carrier in both the front-to-back and lateral directions. When the substrate aligner is closed, the compliant engagement members hold the substrates in a fixed or locked position, so that they cannot move during transport. The substrates are thus protected from induced g-forces and vibrations applied to the carrier. The substrates are also prevented from sliding to prevent generation of particulate that could potentially contaminate the product on the substrates. A substrate aligner according to the present invention further allows a substantial amount of clearance to exist around the substrate edges. This increased clearance enables robotic pick and place units to operate at higher speeds when inserting and extracting the substrate, thereby substantially improving the throughput of processing stations.

BRIEF DESCRIPTION OF THE DRAWINGS

A better understanding of the present invention can be obtained when the following detailed description of the preferred embodiment is considered in conjunction with the following drawings, in which:

FIG. 1 is a perspective view of a substrate carrier including a substrate aligner according to one embodiment of the present invention;

FIG. 2 is a perspective view illustrating the underside of the substrate carrier of FIG. 1;

FIGS. 3A and 3B are top views of the substrate carrier of FIG. 1 illustrating the substrate aligner in open and closed positions, respectively;

FIG. 4 is a front view of the substrate carrier of FIG. 1;

FIG. 4A is a blown-up view of a portion of FIG. 4 illustrating an actuator assembly interfacing an engagement assembly of the substrate aligner of FIG. 1;

FIG. 5 is an exploded view of the engagement assembly of FIG. 1;

DETAILED DESCRIPTION OF THE PREFERRED EMBODIMENT

Figure 3B:
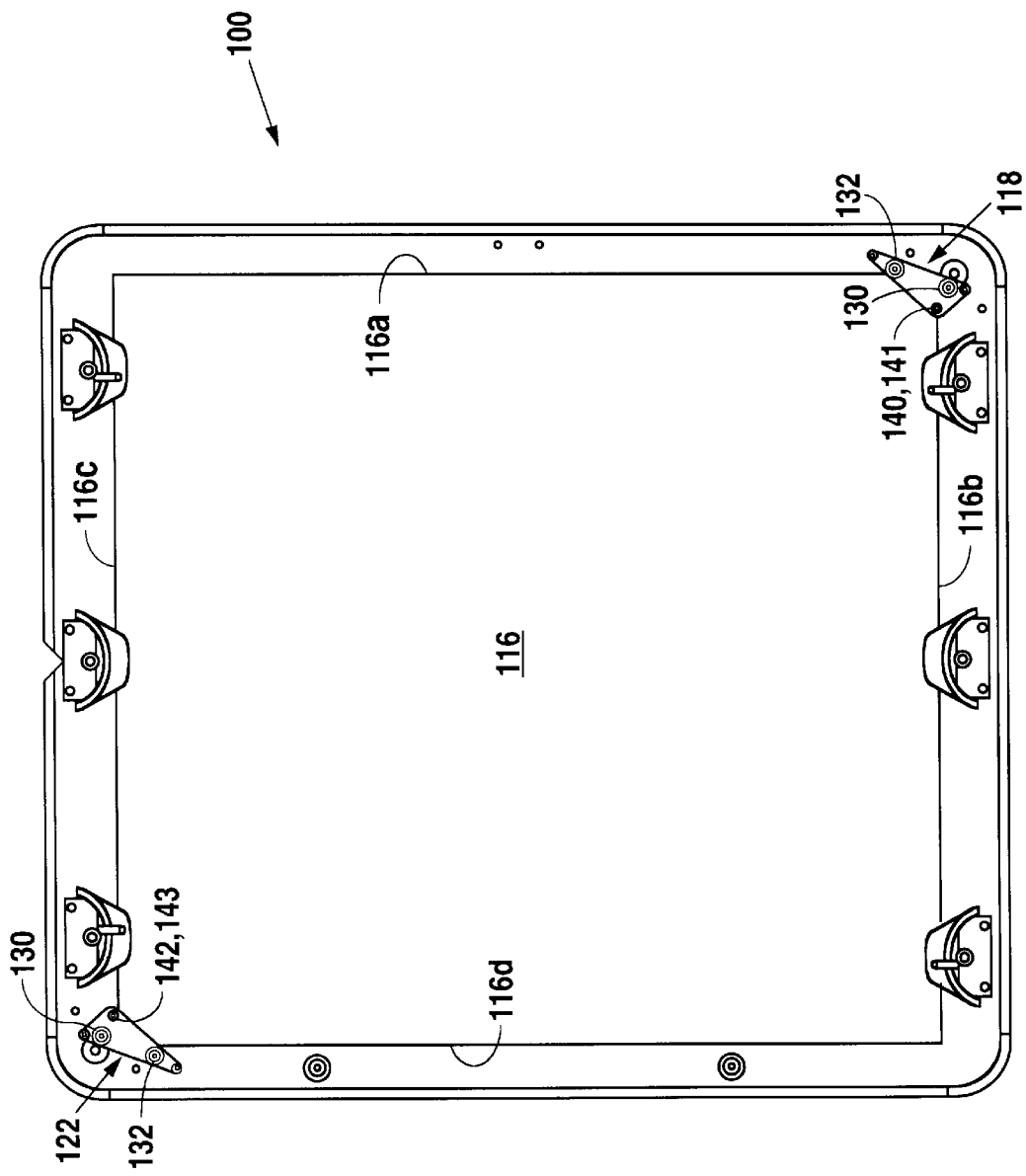

Referring now to FIG. 1, a perspective view is shown of a substrate cassette or carrier 100 including a substrate aligner implemented according to one embodiment of the present invention. The substrate carrier 100 is an open-air unit for receiving, supporting and aligning a plurality of substrates in a spaced relationship relative to one another for transporting the substrates between processing stations and for presenting substrates in alignment to a processing station. A processing station preferably includes robotic pick and place units for inserting and/or extracting the substrates into the substrate carrier 100. The substrates are preferably flat panel displays (FPDs), semiconductor wafers, masks, microchip modules (MCM), etc. The substrate carrier 100 is of any convenient size, depending upon the type and size of the substrates being handled. The substrate carrier 100, for example, is preferably used for relatively large substrates having a size of 650 mm×550 mm to 850 mm×1050 mm or larger. The present invention is not limited, however, to any particular type or size of substrate, and may be used for any type or size of substrate.

The substrate carrier 100 includes a substantially rectangular top plate 102 mounted to another substantially rectangular bottom plate 104 using a plurality of support posts 106. As shown in FIG. 1, three support posts 106 are mounted on either side of the substrate carrier 100, forming an open, box-like structure having an open front end 112 and an open back end 114 for receiving and supporting one or more rectangular substrates 116. Only one substrate 116 is shown for purposes of illustration, it being understood that typically a plurality of substrates are loaded in the substrate carrier 100, such as shown in FIG. 4. Mounted to each support post 106 is a tower or comb 108 having spaced teeth or shelves 110, each shelf 110 for receiving and supporting a corresponding substrate. The plurality of spaced shelves 110 are provided to receive and support a plurality of substrates 116 in spaced relationship relative to each other within the substrate carrier 100. An optional handle 102a is preferably mounted to the top plate 102 for manipulating the substrate carrier 100 between carts and processing stations, and for also carrying the substrate carrier when empty. It is noted that the substrate carrier 100 is open and is intended for transportation of the substrates in a substantially clean room environment, since an open structure does not protect the interior from particles in the ambient or surrounding air. As described below, the present invention may be used with an enclosed carrier assembly for protecting the substrates 116 within from the outside or ambient air.

After one or more substrates 116 are loaded into the substrate carrier 100, a substrate aligner, including a front engagement assembly 118 and a back engagement assembly 122, is provided for engaging and constraining the substrates 116 into an aligned position. In the preferred embodiment, the front engagement assembly 118 is pivotally mounted between the bottom plate 104 and top plate 102 at a front corner of the substrate carrier 100, while the back engagement assembly 122 is pivotally mounted in a similar manner at an opposite back corner of the substrate carrier 100. Each engagement assembly 118, 122 includes a first engagement member 130 and a second engagement member 132 for engaging one side edge and adjacent front or back edge of each of the substrates 116. In particular, the front engagement assembly 118 includes a first engagement member 130 for engaging a side edge 116b and a second engagement member 132 for engaging the front edge 116a of each substrate 116, whereas the back engagement assembly 122 includes a similar first engagement member 130 for engaging a side edge 116c and a second engagement member 132 for engaging a back edge 116d of each substrate 116. In this manner, four separate engagement members engage the substrates 116 to constrain the substrates 116 in an aligned position within the substrate carrier 100.

The aligned position is preferably a substantially centered position within the substrate carrier 100 in both the lateral direction, or from side to side, and the front to back direction. Thus, the front and back edges 116a, d of the substrates 116 are aligned with respect to the front and back edges, respectively, of the substrate carrier 100, whereas the side edges 116b, c of the substrates 116 are aligned with respective sides of the substrate carrier 100. Four separate engagement members engaging the four edges of the substantially rectangular substrates 116 assure substantial alignment without a significant degree of rotation. In the preferred embodiment, such alignment is within +/−0.5 mm in both the lateral or side-to-side direction as well as in the front to back direction. As described further below, the engagement members 130, 132 are preferably cylindrical or tubular rollers pivotally mounted so that they rotate while engaging respective edges of the substrate 116. This rotational movement substantially reduces the amount of contaminating particulate that might otherwise be generated while scraping the edges of the substrate 116.

Each of the engagement assemblies 118, 122 further include an upper support plate 134 pivotally mounted to the top plate 102, a lower support plate 136 and two support posts 138 for mounting the upper and lower support plates 134, 136 to each other. The engagement members 130 and 132 are mounted between the upper and lower support plates 134, 136 for orthogonally engaging corresponding edges of the substrates 116. As described further below, a front actuator assembly 120 is mounted to the bottom side of a front corner of the bottom plate 104 for interfacing the front engagement assembly 118 for pivoting the front engagement assembly 118 between open and closed positions. For the front engagement assembly 118, the lower support plate 136 pivots about a pivot point 140 and the upper support plate 134 pivots about a pivot point 141, so that the front engagement assembly 118 pivots about a pivot axis between the points 140 and 141. The pivot axis is simply referred to as pivot axis 140–141. For the back engagement assembly 122, the lower support plate 136 pivots about a pivot point 142 (FIGS. 3A and 4) and the upper support plate 134 pivots about a pivot point 143, so that the back engagement assembly 122 pivots about a pivot axis 142–143.

Referring now to FIG. 2, a perspective view is shown of the underside of the substrate carrier 100. As shown, the front actuator assembly 120 is mounted at the same front corner of the substrate carrier 100 to interface the front engagement assembly 118. Likewise, the back actuator assembly 124 is mounted to the opposite back corner of the substrate carrier 100 for interfacing the back engagement assembly 122. It is noted that the actuator assemblies 120, 124 may be mounted at other locations, such as to the top plate 102, or in other convenient locations for interfacing and manipulating the engagement assemblies 118, 122, respectively. In the embodiment shown, the actuator assemblies 120, 124 are mounted to the bottom plate 104 for convenient access and engagement by drive motors and gear assemblies (not shown) on processing stations (not shown) for indirectly manipulating the engagement assemblies 118, 122. In particular, the processing station places the engagement assemblies 118, 122 in an open position for inserting or otherwise removing the substrates 116 to and from the substrate carrier 100 during processing. The processing station can then place the assemblies 118, 122 in closed positions for placing the substrates 116 into aligned positions for transport.

Referring now to FIGS. 3A and 3B, top views are shown of the substrate carrier 100 with the top plate 102 removed and with the engagement assemblies 118, 122 in their open and closed positions, respectively. When the engagement assemblies 118, 122 are in their open positions as shown in FIG. 3A, the substrates 116 may be removed from and other substrates inserted into the open front end 112 and/or the open back end 114. Thus, a robotic system of a processing station can access each substrate 116 from either the open front end 112 or the open back end 114, depending upon how the substrate carrier 100 is positioned relative to the processing station. Although the combs 108 maintain the substrates 116 in a substantially parallel plane with the bottom and top plates 104, 102 of the substrate carrier 100, which are all preferably in horizontal positions relative to the ground during transport, the combs 108 need not be configured to keep the substrates 116 in a substantially aligned position. Thus, the substrates 116 may each be positioned slightly towards the front end 112 or towards the back end 114 and may even be in a significantly rotated position so that the side edges 116b and 116c are not aligned with the side edges of the top and bottom plates 102, 104. It is noted that although the substrates 116 are in the aligned position immediately after the engagement assemblies 118, 122 are opened, the substrates 116 may be left in a substantially non-aligned position by the processing station after processing is complete. Thus, although it is desired to have the substrates 116 in aligned positions for access by the processing station, the processing station need not leave them in such aligned position after processing.

As shown in FIG. 3A, the engagement assemblies 118 and 122 have been rotated about the pivot axes 140–141, 142–143, respectively, to their open positions. In the open position, an alignment line 144 defined between the pivot point 140 and the center of the engagement member 132 is at an approximately 20–30 degree negative rotation relative to, while the engagement members 130, 132 are substantially aligned in parallel with, the side edge of the substrate carrier 100. The engagement members 130, 132 are positioned outside the boundaries of the substrates 116 in the open position. The engagement assembly 118 is pivoted until the engagement member 132 and the pivot point 140 are aligned along a closed line 146. An arrow 148 indicates approximately 65 degrees of rotation between the open line 144 and the closed line 146, illustrating the amount of rotation of the front engagement assembly 118 between the open and closed positions. The back engagement assembly 122 is pivoted approximately 65 degrees about the pivot axis 142–143 between the open and closed positions in a substantially similar manner.

In FIG. 3B the engagement assemblies 118, 122 have been rotated to their closed positions. FIG. 3B more clearly illustrates that the engagement member 130 of the engagement assembly 118 engages the side edges 116b, whereas the engagement member 132 engages the front edges 116a of the substrates 116. Likewise, the engagement members 130, 132 of the back engagement assembly 122 engage the side and back edges 116c, 116d, respectively, of the substrates 116. As the engagement assemblies 118, 122 are pivoted to the closed position from the open position, the engagement members 130 engage the side edges 116b, 116c of the substrates 116 to place the side edges 116b, 116c in a substantially aligned position relative to the side edges of the substrate carrier 100. In the preferred embodiment, such alignment is within +/−0.5 mm in the lateral or side-to-side direction.

While the engagement members 130 are engaging the side edges 116b, c, the engagement members 132 of the engagement assemblies 118, 122 engage the front and back edges 116a, d to simultaneously align the substrates 116 in the front-to-back direction. Again, the substrates 116 is aligned to within 0.5 mm of a desired and predetermined aligned position within the substrate carrier 100. It is noted that simultaneous alignment of both sides 116b, 116c and the front and back edges 116a, 116d at opposite corners of the substrates 116 aligns the substrates 116 in the lateral and front-to-back directions, thereby also preventing the substrates 116 from resting in any rotated position.

As further described below, the engagement members 130, 132 of both engagement assemblies 118, 122 include compliant sheaths or otherwise have compliant outer surfaces, thereby providing a predetermined amount of flexibility to prevent forces applied to the substrate carrier 100 from being applied to the substrates 116. Such alignment force on the four edges is sufficient to engage and manipulate the substrates 116 into substantially aligned positions without excessive force, which might otherwise damage the substrates 116. The particular amount of alignment force applied, as well as the compliancy of the engagement members 130, 132, are chosen based on the particular size, type and composition of the particular substrates involved. Force is applied by the processing station and the gap in the roller is increased for the mechanical tolerance.

FIG. 4 is a front view of the substrate carrier 100 more clearly showing the positions of the engagement members 130, 132 of both engagement assemblies 118, 122 relative to several substrates 116. As shown in the lower right corner of FIG. 4, a gap exists between the side edges 116c and the engagement member 130 of the back engagement assembly 122. The combs 108 preferably include a partially slanted side wall 109 between respective shelves 110, where the side edges 116c are spaced away from the side wall 109 when in the aligned position. In a similar manner, the opposite edge 116b of each of the substrates 116 is separated from the corresponding wall 109 on the opposite side. Such separations or gaps are substantially greater than gaps in prior art or traditional carriers. In fact, the gaps between the side walls 109 and the side edges 116b, c are up to ten (10) times greater than corresponding clearances of prior art.

Prior art carriers included alignment walls with significantly greater slants to achieve less gap when the substrates rested on the shelves. In fact, the slanted walls in prior art designs abutted or otherwise contacted the side edges of the substrates. This provided a rough alignment of the substrates for a robotic pick and place unit of the processing station. However, such method of alignment also forced the robot unit to extract and insert the substrate more slowly to avoid collision and/or scraping with the side walls of the shelves. This relatively tight fit correspondingly reduced overall throughput of the processing station.

Alignment using the side walls is not necessary using a substrate aligner according to the present invention. The side walls 109 preferably include a slight slant for gross alignment, but are fashioned to provide substantially wider slots and clearances as compared to prior art. Because of such large clearances, the robotic pick and place units are operated at substantially increased speed because of substantially less risk of collision and/or scraping against the side walls 109. Thus, the robotic units can operate substantially faster, thereby substantially increasing throughput of the processing station.

FIG. 4A is a blown-up view of a portion of FIG. 4 (detail A) showing more detail of the front actuator assembly 120 mounted to the bottom plate 104 and interfacing the lower portion of the front engagement assembly 118. The actuator assembly 120 includes an input drive shaft 152 for engaging a motor and gear assembly or the like (not shown) for causing rotation of an output drive shaft 150. The output drive shaft 150 extends through a hole or opening provided in the bottom plate 104 for engaging the engagement assembly 118. In the preferred embodiment, the output drive shaft 150 engages a corresponding adapter on the lower side of the lower support plate 136 centered at the pivot point 140. Thus, the actuator assembly 120 rotates the front engagement assembly 118 through the output drive shaft 150. The front engagement assembly 118 is shown in the closed position, where engagement member 130 is engaged with the side edge 116b and the engagement member 132 is engaged with the front edge 116a of the substrate 116. The back actuator assembly 124 is mounted to the bottom plate 104 for interfacing the back engagement assembly 122 in substantially the same manner.

Referring now to FIG. 5, an exploded view is shown of the front engagement assembly 118, where the back engagement assembly 122 is implemented in an identical manner and is thus not shown. The support posts 138 have opposite ends mounted to the upper and lower support plates 134, 136 using screws or rivets or the like 168. In particular, holes 134a, 136a are drilled through the upper and lower plates 134, 136, respectively, where the screws 168 are inserted through the holes 134a, 136a into the opposite ends of the support posts 138. The engagement members 130, 132 are preferably rollers, which include roller interfaces 160 within roller tubes 131 that are pivotally mounted between the upper and lower support plates 134, 136 using flanged bearings 166. In this manner, the support posts 138 are rigidly mounted to the upper and lower support plates 134, 136 providing a rigid structure to enable the roller tubes 131 to rotate freely relative to the upper and lower support plates 134, 136.

The roller tubes 131 are preferably made from a compliant material, such as TYGON or the like. Alternatively, the roller tubes 131 include a compliant sheath of the same material fitted over the roller tubes 131. The compliant material is selected to provide sufficient support to apply alignment force without damaging the edges of the substrates 116. Also, the compliant material substantially reduces particulate generation during engagement with an edge of the substrates, and dampens forces applied to the substrate carrier 100 to shield the substrates 116. A shoulder bolt 162, several shaft spacers 164 and a flange bearing 166 are provided to pivotally mount the upper support plate 134 to the top plate 102. The lower support plate 136 of each of the engagement assemblies 118 and 122 is preferably mounted to the output drive shaft 150 of the corresponding actuator assemblies 120 and 124, rather than being mounted directly to the bottom plate 104.

Figure 6:
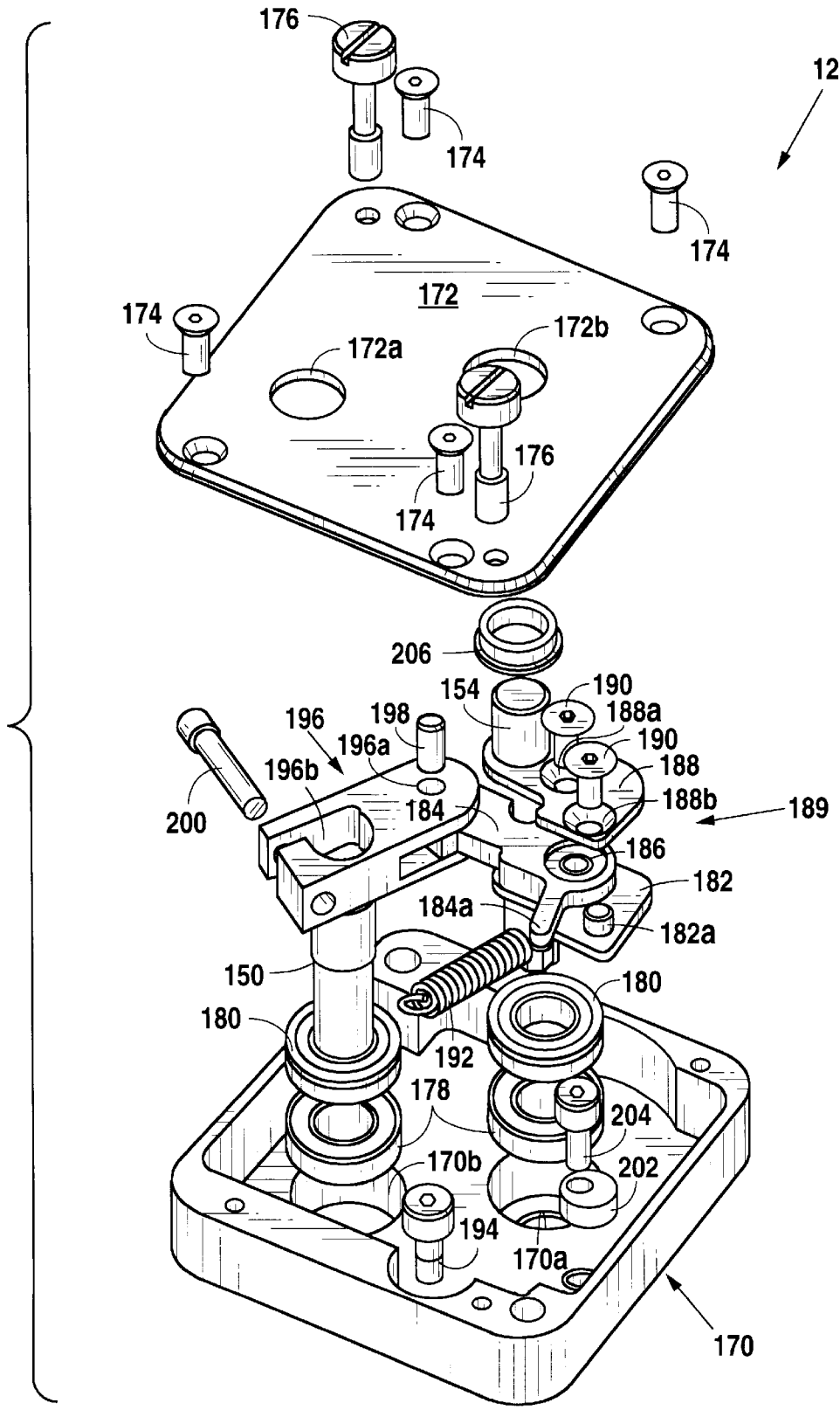
FIG. 6 is an exploded view of the actuator assembly of FIG. 1.

Referring now to FIG. 6, an exploded view is shown of the front actuator assembly 120. The actuator assembly 124 is preferably implemented in a substantially identical manner. The actuator assemblies 120, 124 are preferably implemented with a four bar linkage incorporating an over-center design to achieve a bistable mode. This enables the assembly to lock in either the open or closed position, as further described below. The actuator assembly 120 includes a drive housing 170 and a drive cover 172, which is mounted to the drive housing 170 using a plurality of screws, rivets or other fasteners 174. The drive housing 170 includes a hole or opening 170a for enabling external access of the input drive shaft 152 and the cover plate 172 includes a hole or opening 172a for enabling external access of the output drive shaft 150. Two or more captive screws 176 are screwed through the cover plate 172 and the drive housing 170 for mounting the actuator assembly 120 to the bottom plate 104 of the substrate carrier 100.

A bearing 178 and flange bearing 180 are inserted within the opening 170a for receiving and enabling pivotal action or rotational movement of the input drive shaft 152. The input drive shaft 152 is integrally mounted on one end of the lower side of a lower drive crank 182. A hole (not shown) is provided at approximately the center of the lower drive crank 182 for pivotally mounting one end of a coupler 184 including a bearing 186. The coupler 184 is preferably mounted between the lower drive crank 182 and a similar upper drive crank 188 using a screw or rivet 190 or the like inserted through a hole 188a of the upper drive crank 188, through the bearing 186 of the coupler 184 and into the corresponding hole of the lower drive crank 182. Another hole 188b in the upper drive crank 188 receives another screw or rivet 190 for interfacing a socket 182a mounted to the lower drive crank 182. In this manner, the upper and lower drive cranks 188, 182 are rigidly mounted together forming a drive crank assembly 189, which enables the coupler 184 to pivot about the center of the bearing 186 relative to the drive crank assembly 189.

The coupler 184 includes an extension lever 184a integrally mounted thereto for pivotally mounting one end of an extension spring 192. The other end of the extension spring 192 is pivotally mounted to the drive housing 170 using a shoulder bolt 194. As described more fully below, the extension spring 192 applies force to the coupler 184 for maintaining the coupler 184 and the drive crank assembly 189 in either an open or closed is locked position.

The other end of the coupler 184 includes an opening or hole (not shown) for pivotally mounting one end of a rocker 196, which has a corresponding hole 196a for receiving a dowel pin 198. Thus, one end of the rocker 196 pivots at the center of the hole 196a relative to the coupler 184. The rocker 196 includes a socket 196b implemented as a clamp, which is tightened using a socket screw 200 to receive and clamp the output drive shaft 150 within the socket 196b. One end of the output drive shaft 150 is pivotally mounted to the drive housing 170 using a bearing 178 and flange bearing 180 within a corresponding opening or hole 170b, where the other end of the output drive shaft 150 extends through the hole 172a for interfacing the engagement assembly 118 or 122 as described previously.

A hard stop 202 is mounted to the drive housing 170 using a screw or rivet 204 or the like for engaging the drive crank assembly 189 in the closed position as described more fully below. The upper drive crank 188 also includes a manual input shaft 154 integrally mounted thereto and extending through a crankshaft bushing 206 through another hole 172b in the drive cover 172. The manual input shaft 154 is concentric with the input drive shaft 152, which is further concentric or otherwise centered in the hole 170a. Thus, the drive crank assembly 189 pivots relative to the center of the opening 170a, the input drive shaft 152 and the manual drive crank 154.

Figure 7A:
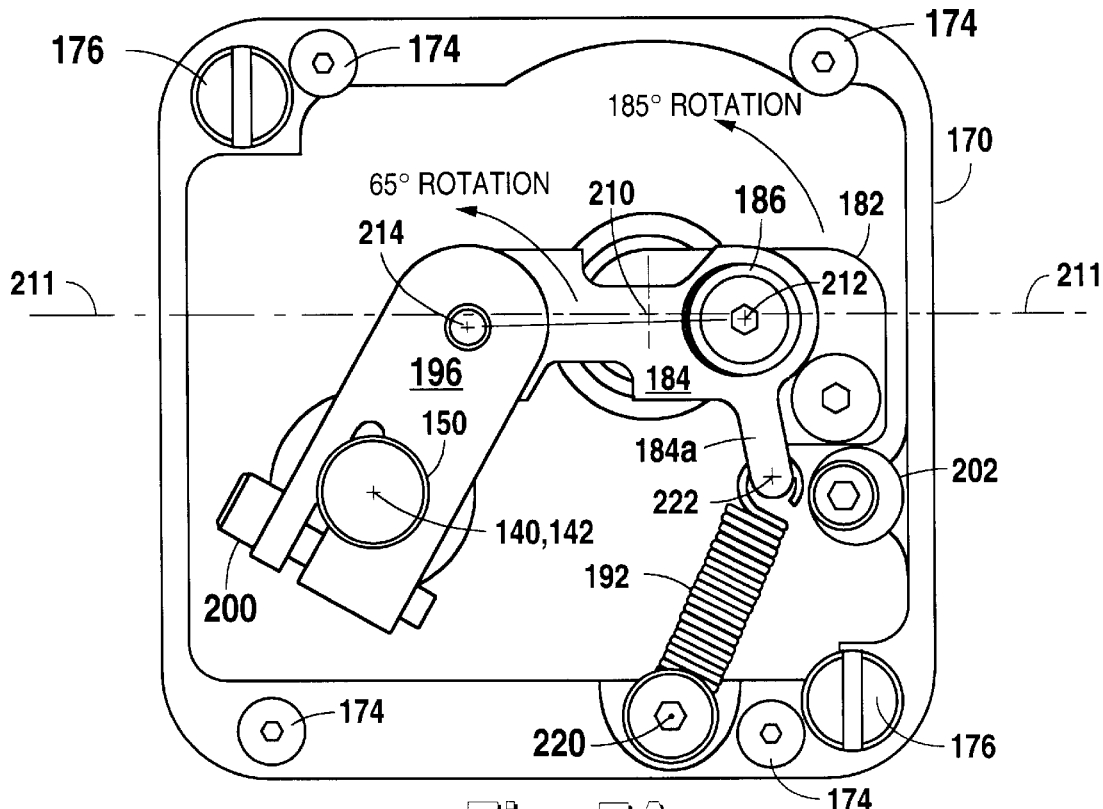
FIGS. 7A and 7B are top views of the alignment assembly of FIG. 6 shown in open and closed positions, respectively.

Referring now to FIG. 7A, a top view is shown of the assembled actuator assembly 120 with the drive cover 172 removed and the upper drive crank 188 is not shown for purposes of clarity. The lower drive crank 182 is shown abutted against the hard stop 202 in the closed position. The lower drive crank 182 pivots about a drive crank pivot point 210 corresponding to the center of the opening 170a and the center of the input drive shaft 152. Thus, the drive crank assembly 189 pivots relative to the drive crank pivot point 210 between the closed or fully clockwise position shown in FIG. 7A and an open or counterclockwise position shown in FIG. 7B.

Counterclockwise rotation force or torque applied to either the input drive shaft 152 or the concentric manual input shaft 154 pivots the lower drive crank 182 in a counterclockwise direction relative to the drive crank pivot point 210. A coupler pivot point 212 positioned at the center of the bearing 186 correspondingly rotates in a counterclockwise direction relative to the drive crank pivot point 210, causing the coupler 184 to move in a substantially translateral manner, thereby applying counterclockwise rotational force to the rocker 196. Such force is applied at a pivot point 214 between the rocker 196 and the coupler 184 to correspondingly rotate the rocker 196 and the output drive shaft 150 relative to the pivot axis 140–142.

When the actuator assembly 120 is in the closed position as shown in FIG. 7A, the lower drive crank 182 causes the pivot point 212 to rotate past or below a horizontal reference line 211 drawn through the drive crank pivot point 210, thereby causing a slightly negative angle of a line of force 218a defined between the pivot points 212 and 214. In this manner, counterclockwise torque forces applied to the output drive shaft 150 caused by g-forces or vibration forces applied to the substrates 116 translates to a clockwise force applied to the lower drive crank 182 due to the negative angle of the line of force 218a. This is referred to as an over-center design. Since the lower drive crank 182 is further pressed against the hard stop 202 and thereby prevented from further clockwise rotation, such torque forces applied to the output drive shaft 150 prevent opening of the engagement assemblies 118, 122. In this manner, the output drive shaft 150 remains locked in the closed position so that the substrates 116 are maintained in an aligned position in spite of counteractive forces. The extension spring 192 applies force to the coupler 184 to enforce and maintain the lower drive crank 182 in substantially the closed position.

Figure 7B:
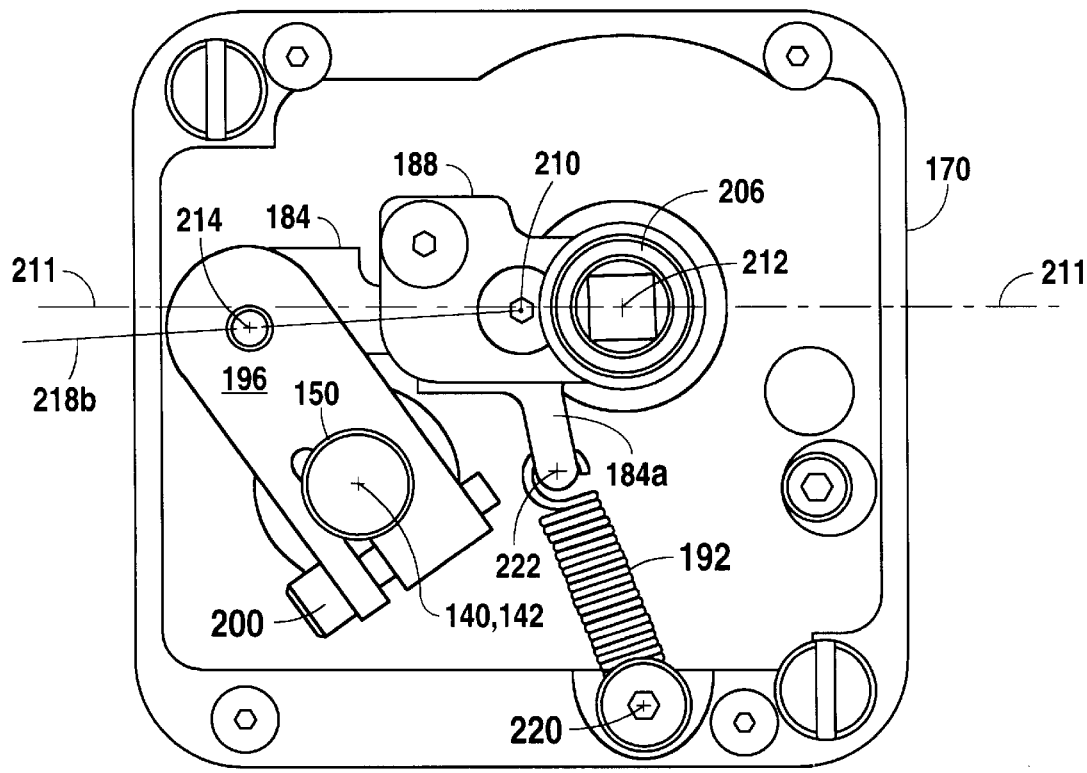

FIG. 7B is a top view of the actuator assembly 120 with the cover plate 172 removed and in the open position. The drive crank assembly 189 has been rotated in the counterclockwise direction by approximately 185°, so that it is once again rotated slightly past or below the horizontal reference line 211. This also is an over-center position to lock the assembly in the open position. The coupler 184 is translated to rotate the rocker 196 approximately 65° in a counterclockwise manner to its open position, which corresponds to the 65° rotation of the engagement assemblies 118, 122 shown in FIGS. 3A, 3B. Of course, such rotation is also applied to the output drive shaft 150. The new line of force 218b in the open position between the pivot points 210 and 214 prevents torque force applied to the output drive shaft 150 and the rocker 196 from rotating the drive crank assembly 189 in the clockwise direction. Such clockwise torque force applied to the output drive shaft 150 and rocker 196 tends to rotate the drive crank 182, 188 in the counterclockwise direction due to the line of force 218b, thereby preventing the front and back engagement assemblies 118, 122 from being closed due to external forces. The extension spring 192 applies force to the coupler 184 to enforce and maintain the assembly in the open position until moved to the closed position by the drive shafts 152 or 154.

Figure 8:
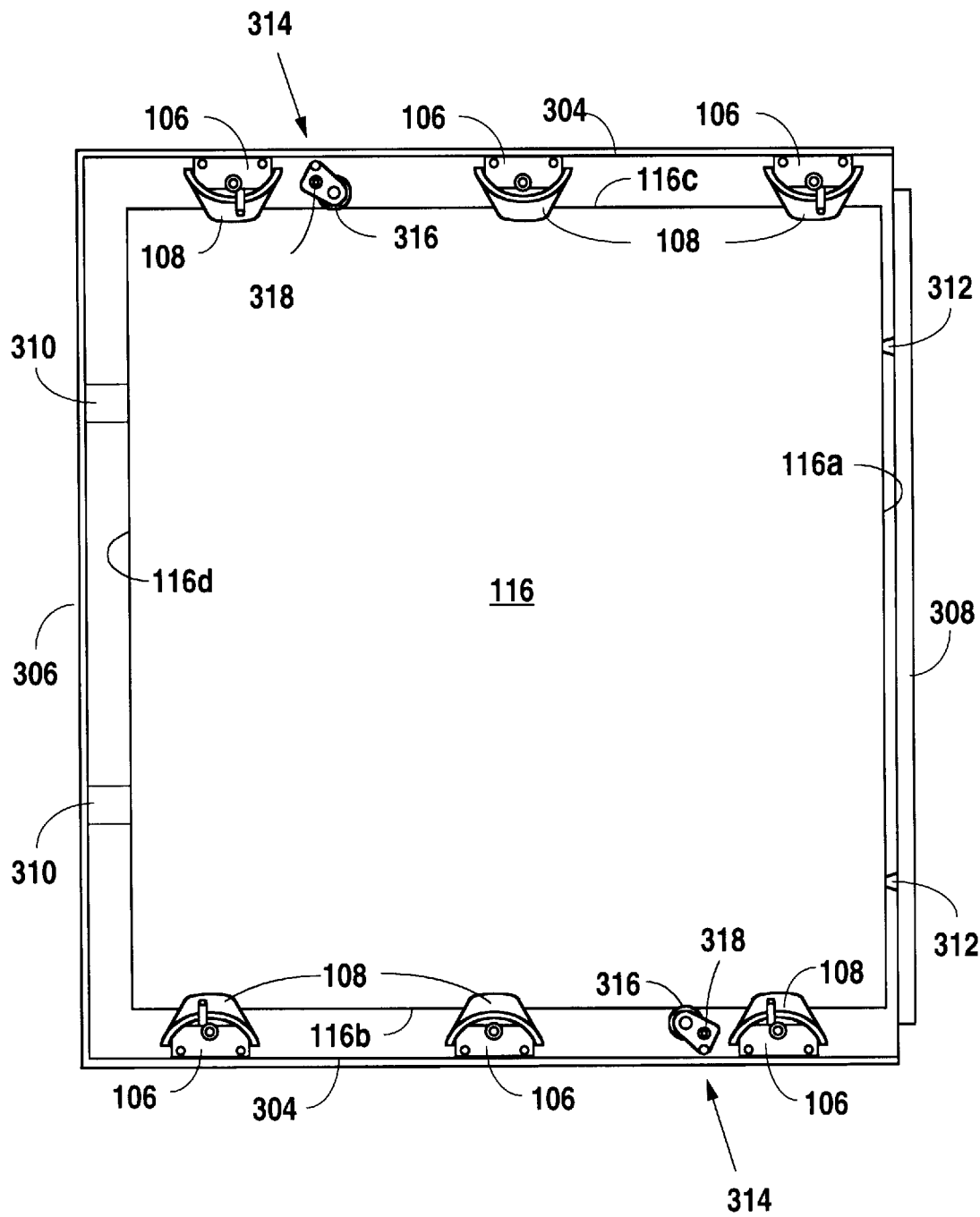
FIG. 8 is a top view of a closed substrate carrier including a substrate aligner according to an alternative embodiment of the present invention.

Referring now to FIG. 8, a top view of a substrate carrier 300 is shown implemented according to an alternative embodiment of the present invention. The substrate carrier 300 is similar to the substrate carrier 100, except that it includes an enclosure 302 for preventing fluid communication between the inner portion of the enclosure 302 and the outside ambient air. The substrate carrier 300 thus protects the substrates 116 mounted within from exposure to external ambient air and enables transport between clean room environments through contaminated air.

Figure 9:
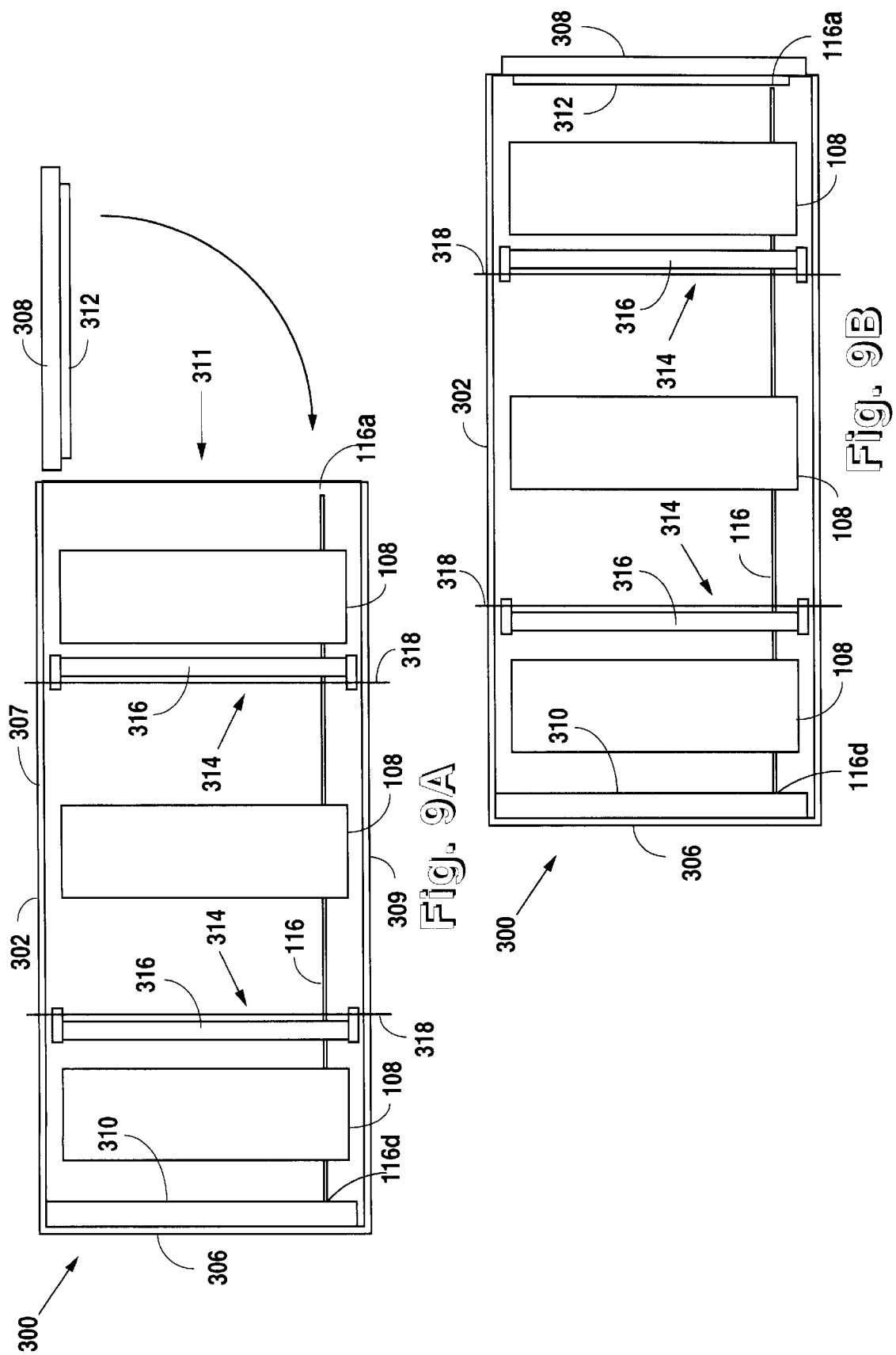
FIGS. 9A and 9B are side views of the substrate carrier of FIG. 8 illustrating a front door in open and closed positions, respectively.

In particular, the enclosure 302 includes side walls 304 and a back wall 306 integrally mounted to a top plate 307 and bottom plate 309 (FIG. 9A). A front door 308 is pivotally mounted to the top plate 307 of the enclosure 302, where the front door 308 opens and closes for allowing internal access of the enclosure 302 through a front opening 311 (FIG. 9A) to insert or otherwise remove substrates 116. The substrates 116 are inserted and maintained in spaced relationship to each other in a similar manner as described for the substrate carrier 100. However, substrate back stops 310 are provided to interface the back edges 116d of the substrates 116. Door bumpers 312 are mounted on the inner surface of the front door 308, which engage the front edges 116a of the substrates 116 when the front door 308 is closed. In this manner, the door bumpers 312 force engagement with the back stops 310 substantially align the substrates 116 in the front-to-back direction when the front door 308 is closed as shown in FIG. 8. The back stops 310 and the door bumpers 312 preferably include a compliant material to interface the back and front edges 116a, d, respectively, of the substrates 116, in a similar manner for similar purposes as described above for the roller tubes 131.

For lateral alignment, side engagement assemblies 314 are provided on opposite sides of the substrate carrier 300. The engagement assemblies 314 each include engagement members 316 which engage the side edges 116b, c of the substrates 116 to move the substrates 116 into a laterally aligned position. In a similar manner as described above for the engagement assemblies 118, 122, the engagement assemblies 314 are pivotally mounted between the top and bottom plates 307, 309 of the substrate carrier 300 between open and closed positions. In the open positions, the engagement members 316 disengage the respective side edges of the substrates 116 to allow extraction and insertion through the front opening 311. The engagement assemblies 314 are rotated or pivoted about pivot points 318 to move the engagement members 316 against the side edges 116b, c of the substrates 116 for lateral alignment.

Once again, the engagement members 316 preferably include compliant rollers or the like which rotate during engagement to avoid scraping, which might otherwise generate contaminating particulate. Also, the engagement assemblies 314 are located off-center of the enclosure 302, where one assembly is mounted towards the back wall 306 and the other assembly is mounted towards the front door 308. This prevents a rotated position once the front door 308 is closed, thereby resulting in substantial alignment of the substrates 116 in both the front-to-back and lateral directions.

FIGS. 9A and 9B are side views of the substrate carrier 300 with the front door 308 open and closed, respectively. With the front door 308 open, the substrates 116 are extracted and inserted through the open front end 311. The side aligner assemblies 314 are pivoted to engage the engagement members 316 against the side edges 116b, c of the substrates 116 for lateral alignment. The engagement members 316 nonetheless allow the substrates 116 to slightly move towards the front or back of the enclosure 302. As shown in FIG. 9B, the front door 308 is closed, so that the door bumper 312 engages the front edges 116a, and the back stops 310 engage the back edges 116d, respectively, of the substrates 116. Once the front door 308 and the engagement assemblies 314 are closed, the substrates 116 are substantially in an aligned position in both front-to-back and lateral directions. It is noted that the front door 308 could be closed after the engagement assemblies 314 are rotated to the closed positions.

After the enclosure 302 is transported to a processing station, the front door 308 is opened and the side aligner assemblies 314 are opened, yet the substrates 116 loaded therein remain in a substantially aligned position for access by the robotic system or the like. After one or more substrates are processed, realignment is achieved by closing the engagement assemblies 314 and closing the front door 308. It is noted that although the substrate carrier 300 is enclosed, the embodiment of back stops, front bumpers and side-mounted engagement assemblies could be applied to an open carrier.

Figure 10:
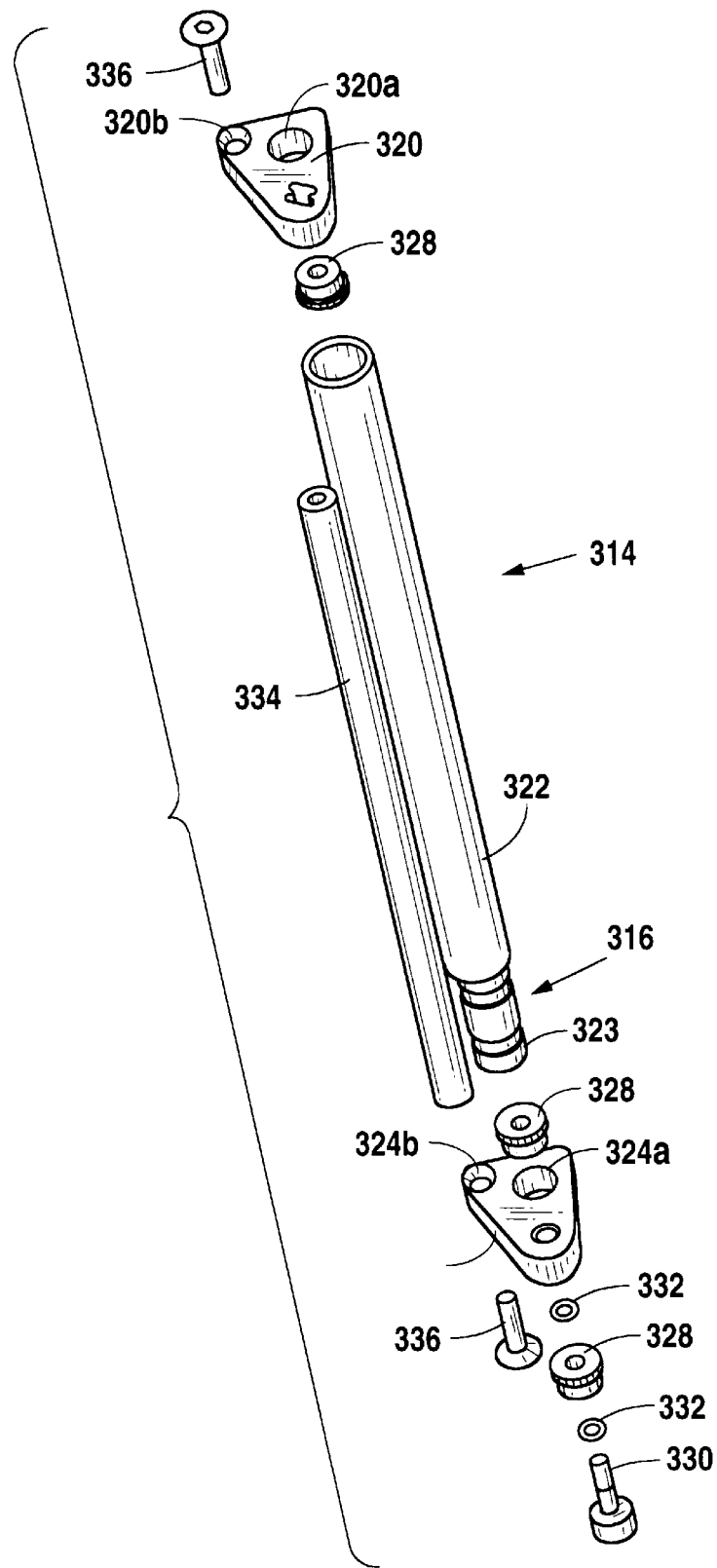
FIG. 10 is an exploded view of a single roller-assembly used as the engagement assembly of FIG. 8.

Referring now to FIG. 10, an exploded view of a single roller engagement assembly is shown for implementing the engagement assembly 314. The engagement assembly 314 is similar to that shown in FIG. 5 for the dual roller assemblies 118, 122, except that only a single support post 334, roller interface 323 and roller tube 322 are provided between an upper plate 320 and a lower plate 324. Again, screws or other fastening means 336 are provided for mounting the support post 334 between the upper and lower support plates 320, 324, and flange bearings 328 are provided on either end of the roller tube 323 to enable rotational movement of the roller tube 323 relative to the upper and lower support plates 320, 324. Also, a shoulder bolt 330, shaft spacers 332 and another flanged bearing 328 are provided to pivotally mount the engagement assembly 314 to the substrate carrier 300.

It is now appreciated that a substrate aligner according to the present invention provides may advantages over substrate carriers of prior art. The substrates are aligned and maintained in an aligned position during transport to reduce the effect of damaging and contaminating forces. Also, the aligned position is substantially more accurate than gross alignment technique of prior art. The substrate aligner also allows significantly greater clearances around the substrates thereby increasing throughput of the processing station.

Although the system and method of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

We claim:

1. A substrate aligner for a substrate carrier, the carrier including a housing for receiving and supporting a plurality of substrates in a spaced relationship relative to each other, said substrate aligner comprising:

an engagement assembly for mounting to the housing for engaging, moving and maintaining the plurality of substrates into a substantially linearly and rotationally aligned position when said engagement assembly is moved to a closed position and for being disengaged from the plurality of substrates when in an open position for allowing insertion and extraction of the plurality of substrates; and an actuator assembly for mounting to the housing and operatively coupled to move said engagement assembly between said open and closed positions.

2. The substrate aligner of claim 1, wherein said engagement assembly comprises:

a first engagement assembly; and a second engagement assembly.

3. A substrate aligner for use with a substrate carrier, the carrier including a substantially rectangular housing for receiving and supporting a plurality of substrates in a spaced relationship relative to each other, said substrate aligner comprising:

an engagement assembly including a front engagement assembly and a back engagement assembly that are each configured to be pivotally mounted to the housing for engaging and maintaining the plurality of substrates in a substantially aligned position when said engagement assembly is moved to a closed position and for disengaging the plurality of substrates when in an open position to allow insertion and extraction of the plurality of substrates; and an actuator assembly configured to be mounted to the housing and operatively coupled to said engagement assembly to move said engagement assembly between said open and closed positions.

4. The substrate aligner of claim 3, wherein said actuator assembly comprises:

a front actuator assembly for mounting near said front corner of the housing for pivotally engaging said front engagement assembly; and a back actuator assembly for mounting near said back corner of the housing for pivotally engaging said back engagement assembly.

5. The substrate aligner of claim 4, wherein said front and back actuator assemblies each comprise:

an actuator housing for mounting to the housing of the carrier;

an output shaft pivotally mounted to said actuator housing and for pivotally engaging a corresponding engagement assembly; and a multiple bar linkage operatively coupled to said output shaft to move said corresponding engagement assembly between said open and closed positions.

6. The substrate aligner of claim 5, wherein said multiple bar linkage has two stable modes corresponding to said open and closed positions, respectively.

7. A substrate aligner for use with a substrate carrier, the carrier including a substantially rectangular housing for receiving and supporting a plurality of substrates in a spaced relationship relative to each other, said substrate aligner comprising:

an engagement assembly including a front engagement assembly and a back engagement assembly, said front and back engagement assemblies each being configured for mounting to the housing for engaging and maintaining the plurality of substrates in a substantially aligned position when said engagement assembly is moved to a closed position and for disengaging the plurality of substrates when in an open position to allow insertion and extraction of the plurality of substrates, wherein each of said front and back engagement assemblies further includes first and second engagement members that are configured for engaging adjacent edges of each of the plurality of substrates when said front and back engagement assemblies are in closed positions; and an actuator assembly configured for mounting to the housing and operatively coupled to said engagement assembly to move said engagement assembly between said open and closed positions.

8. The substrate aligner of claim 7, wherein said first and second engagement members of said front engagement assembly are provided for engaging a front edge and an adjacent side edge, respectively, of each of the plurality of substrates, and wherein said first and second engagement members of said back engagement assembly are provided for engaging a back edge and an adjacent side edge, respectively, of each of the plurality of substrates, for substantially aligning the substrates in a lateral direction and in a front to back direction with respect to the housing when said front and back engagement assemblies are both in said closed positions.

9. The substrate aligner of claim 7, wherein said first and second engagement members each comprise rollers.

10. The substrate aligner of claim 9, wherein each of said rollers have cylindrical bodies which rotate.

11. The substrate aligner of claim 10, wherein each of said rollers have compliant outer surfaces.

12. The substrate aligner of claim 10, wherein the housing of the carrier includes top and bottom plates, and wherein said front and back engagement assemblies each comprise:

said first and second engagement members each having opposite ends for defining a center line orthogonal with and for extending between the top and bottom plates of the housing; and top and bottom support plates for pivotally mounting said opposite ends of said first and second engagement members to enable rotation about said orthogonal center lines.

13. The substrate aligner of claim 12, wherein said front and back engagement assemblies each further comprise:

a support pole integrally mounted between said top and bottom support plates.

14. The substrate aligner of claim 12, wherein said front and back engagement assemblies are each configured to be pivotally mounted to the housing between the top and bottom plates of the housing.

15. The substrate aligner of claim 14, wherein each of said front and back engagement assemblies pivot with respect to an orthogonal pivot line located between said orthogonal center lines and at an offset from a plane defined by said orthogonal center lines of said first and second engagement members.

16. A substrate aligner for use with a substrate carrier, the carrier including a housing for receiving and supporting a plurality of substrates in a spaced relationship relative to each other, said substrate aligner comprising:

an engagement assembly configured for mounting to the housing for engaging and maintaining the plurality of substrates into a substantially aligned position when said engagement assembly is moved to a closed position and for disengaging the plurality of substrates when in an open position for allowing insertion and extraction of the plurality of substrates; and an actuator assembly configured for mounting to the housing and operatively coupled to pivotally engage said engagement assembly to move said engagement assembly between said open and closed positions.

17. The substrate aligner of claim 16, wherein said actuator assembly comprises:

an actuator housing for mounting to the housing of the carrier;

an output shaft pivotally mounted to said actuator housing and for pivotally engaging said engagement assembly; and a multiple bar linkage operatively coupled to said output shaft to move said engagement assembly between said open and closed positions.

18. The substrate aligner of claim 17, wherein said multiple bar linkage has two stable modes corresponding to said open and closed positions, respectively.

19. The substrate aligner of claim 18, wherein said multiple bar linkage has an over-center design in both open and closed positions to achieve said two stable modes.

20. The substrate aligner of claim 17, wherein said multiple bar linkage comprises a four bar linkage, which comprises:

a drive crank pivotally mounted to said actuator housing and having first and second positions corresponding to said open and closed positions, respectively;

a coupler member having one end pivotally mounted to said drive crank and a second end; and a rocker having a first end pivotally mounted to said second end of said coupler member and a second end;

wherein said output shaft is mounted to said second end of said rocker for engaging and moving said engagement assembly between said open and closed positions when said output shaft is rotated between said first and second positions, respectively.

21. The substrate aligner of claim 20, wherein said actuator assembly further comprises:

an extension spring having one end mounted to said housing and another end attached to said coupler member for applying leverage to enforce said first and second positions of said drive crank.

22. The substrate aligner of claim 21, wherein said drive crank is pivoted relative to a drive crank pivot point to extend a line of force defined by said first and second ends of said coupler member beyond a horizontal base line of said drive crank pivot point in both of said first and second positions to achieve a locking position for said first and second positions.

23. The substrate aligner of claim 1, wherein the housing includes back stops for engaging back edges of the plurality of substrates, and a pivotally mounted front door with front bumpers for engaging and aligning front edges of the plurality of substrates when the front door is closed, so that the plurality of substrates are substantially aligned in the front to back direction of the housing when the front door is closed, said engagement assembly comprising:

first and second engagement assemblies for mounting on opposite sides of the housing for engaging opposite side edges, respectively, of the plurality of substrates and for moving each substrate into a laterally aligned position when said engagement assembly is moved from said open position to said closed position.

24. The substrate aligner of claim 23, wherein:

said first engagement assembly is mounted off-center towards the back of the housing; and wherein said second engagement assembly is mounted off center towards the front of the housing.

25. The substrate aligner of claim 23, wherein said first and second engagement assemblies each include:

an engagement member for engaging a corresponding side edge of each of the plurality of substrates when said engagement assembly is moved to said closed position.

26. The substrate aligner of claim 25, wherein said engagement member comprises a roller which rotates to prevent scraping when engaging the substrates.

27. The substrate aligner of claim 23, wherein said first and second engagement assemblies are for pivotally mounting to the housing.

28. A substrate aligner for a substrate carrier, the substrate carrier including a substantially rectangular housing having front and back sides for receiving and supporting a plurality of substrates in a spaced relationship relative to each other, said substrate aligner comprising:

back stops for mounting to the back side of the housing for engaging back edges of the plurality of substrates;

a pivotally mounted front door with front bumpers for engaging front edges of the plurality of substrates when the front door is closed, so that the plurality of substrates are moved and substantially aligned in the front to back direction of the housing when said front door is closed;

first and second engagement assemblies for mounting on opposite sides of the housing for engaging opposite side edges, respectively, of the plurality of substrates and for moving the substrates into a laterally aligned position when said first and second engagement assemblies are moved from said open position to said closed position; and an actuator assembly for mounting to the housing and operatively coupled to move said engagement assembly between said open and closed positions;

wherein the plurality of substrates are maintained in a substantially aligned position when said front door is closed and when said first and second engagement assemblies are in said closed position.

29. The substrate aligner of claim 28, wherein:

said first engagement assembly is mounted off-center towards the back of the housing; and wherein said second engagement assembly is mounted off-center towards the front of the housing.

30. The substrate aligner of claim 28, wherein said first and second engagement assemblies each include:

an engagement member for engaging a corresponding side edge of each of the plurality of substrates when said engagement assembly is moved to said closed position.

31. The substrate aligner of claim 30, wherein said engagement member comprises a roller pivotally mounted to rotate when engaging the substrates.

32. The substrate aligner of claim 31, wherein said roller has a compliant outer surface.

33. The substrate aligner of claim 28, wherein said first and second engagement assemblies are pivotally mounted to the housing.

34. A substrate carrier for receiving, supporting and aligning a plurality of substrates, comprising:

a housing;

a plurality of combs, each having spaced shelves for receiving and supporting the plurality of substrates in a spaced relationship relative to each other; and a substrate aligner assembly mounted to said housing for engaging and moving and maintaining the plurality of substrates into a substantially aligned position when said substrate aligner assembly is moved to a closed position and for being disengaged from the plurality of substrates when in an open position for allowing insertion and extraction of the plurality of substrates.

35. The substrate carrier of claim 34, wherein said substrate aligner assembly comprises:

an engagement assembly mounted to said housing for aligning the plurality of substrates when in said closed position and for being disengaged from the plurality of substrates when in said open position; and an actuator assembly for mounting to said housing and operatively coupled to move said engagement assembly between said open and closed positions.

36. The substrate carrier of claim 35, wherein the housing is substantially rectangular, and wherein said engagement assembly comprises:

a front engagement assembly pivotally mounted near a front corner of the housing; and a back engagement assembly pivotally mounted near a back corner opposite said front corner of the housing.

37. The substrate carrier of claim 36, wherein said front and back engagement assemblies each comprise:

first and second engagement members for engaging adjacent edges of each of the plurality of substrates when said engagement assembly is in said closed position.

38. The substrate carrier of claim 37, wherein said first and second engagement members of said front engagement assembly engage a front edge and an adjacent side edge, respectively, of each of the plurality of substrates, and wherein said first and second engagement members of said back engagement assembly engage a back edge and an adjacent side edge, respectively, of each of the plurality of substrates, for substantially aligning the substrates in a lateral direction and in a front to back direction with respect to the housing when said front and back engagement assemblies are both in said closed positions.

39. The substrate carrier of claim 38, wherein each of said engagement members comprise rollers having cylindrical bodies which rotate while orthogonally engaging a corresponding edge of the plurality of substrates.

40. The substrate carrier of claim 39, wherein said rollers each have a compliant outer surface.

41. The substrate carrier of claim 35, wherein said actuator assembly comprises:

an actuator housing mounted to said housing of the carrier;

an output shaft pivotally mounted to said actuator housing and for pivotally engaging said engagement assembly; and a multiple bar linkage operatively coupled to said output shaft to move said engagement assembly between said open and closed positions.

42. The substrate carrier of claim 41, wherein said multiple bar linkage has two stable modes corresponding to said open and closed positions, respectively.

43. The substrate carrier of claim 42, wherein said multiple bar linkage has an over-center design in both open and closed positions to achieve said two stable modes.

44. The substrate carrier of claim 41, wherein said multiple bar linkage comprises:

a drive crank pivotally mounted to said actuator housing and having first and second positions corresponding to said open and closed positions, respectively;

a coupler member having one end pivotally mounted to said drive crank and a second end; and a rocker having a first end pivotally mounted to said second end of said coupler member and a second end;

wherein said output shaft is mounted to said second end of said rocker for engaging and moving said engagement assembly between said open and closed positions when said output shaft is rotated between said first and second positions, respectively.

45. The substrate carrier of claim 34, the housing including front and back sides wherein said substrate aligner assembly comprises:

back stops mounted to the back side of said housing for engaging back edges of the plurality of substrates;

a front door for pivotally mounting to the housing, said front door including front bumpers for engaging and aligning front edges of the plurality of substrates when said front door is closed, so that the plurality of substrates are substantially aligned in the front to back direction within said housing when said front door is closed; and first and second engagement assemblies mounted on opposite sides of said housing for engaging opposite side edges, respectively, of the plurality of substrates and for moving the substrates into a laterally aligned position when said first and second engagement assemblies are moved to said closed position.

46. The substrate carrier of claim 45, wherein:

said first engagement assembly is mounted off-center towards said back side of said housing; and wherein said second engagement assembly is mounted off-center towards the front of said housing.

47. The substrate carrier of claim 45, wherein said first and second engagement assemblies each include:

an engagement member for engaging a corresponding side edge of each of the plurality of substrates when said engagement assembly is in said closed position.

48. The substrate carrier of claim 47, wherein said engagement assemblies each further include:

top and bottom support plates; and said engagement member comprising a roller pivotally mounted to rotate between said top and bottom support plates.

49. The substrate carrier of claim 48, wherein said roller has a compliant outer surface for engaging the edges of the substrates.

50. The substrate carrier of claim 45, wherein said first and second engagement assemblies are pivotally mounted to said housing.

* * * * *